United States Patent
Lee et al.

(10) Patent No.: US 9,214,647 B2
(45) Date of Patent: Dec. 15, 2015

(54) ORGANIC LIGHT EMITTING DIODE DEVICE

(75) Inventors: Byoung-Duk Lee, Yongin (KR); Jong-Hyuk Lee, Yongin (KR); Yoon Hyeung Cho, Yongin (KR); Min-Ho Oh, Yongin (KR); So-Young Lee, Yongin (KR); Sun-Young Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 363 days.

(21) Appl. No.: 12/894,980

(22) Filed: Sep. 30, 2010

(65) Prior Publication Data

US 2011/0147789 A1    Jun. 23, 2011

(30) Foreign Application Priority Data

Dec. 18, 2009  (KR) ........................ 10-2009-0127305

(51) Int. Cl.
*H01L 33/00* (2010.01)
*H01L 27/15* (2006.01)
*H01L 51/52* (2006.01)

(52) U.S. Cl.
CPC ........ *H01L 51/5259* (2013.01); *H01L 51/5246* (2013.01); *H01L 51/5253* (2013.01); *H01L 2251/5369* (2013.01)

(58) Field of Classification Search
CPC ............ H01L 51/5237; H01L 51/5253; H01L 51/5259; H01L 51/5246; H01L 2251/5369

USPC .............. 257/79, 40, 100, E33.056, E33.059; 313/504, 512

See application file for complete search history.

(56) References Cited

U.S. PATENT DOCUMENTS

| | | | |
|---|---|---|---|
| 6,226,890 B1 * | 5/2001 | Boroson et al. ................. | 34/472 |
| 6,858,831 B2 * | 2/2005 | Wu et al. ........................ | 250/215 |
| 2003/0038590 A1 | 2/2003 | Silvernail et al. | |
| 2003/0143423 A1 | 7/2003 | McCormick et al. | |
| 2007/0152212 A1 * | 7/2007 | Cho et al. ........................ | 257/40 |
| 2011/0133213 A1 * | 6/2011 | Lee et al. ........................ | 257/79 |

FOREIGN PATENT DOCUMENTS

| | | |
|---|---|---|
| JP | 8236271 A | 9/1996 |
| JP | 2001-338755 | 12/2001 |
| JP | 2006-179318 | 7/2006 |
| JP | 2008-34142 | 2/2008 |
| KR | 10-2004-0078508 | 9/2004 |
| KR | 10-2005-0067364 | 7/2005 |
| KR | 10-2006-0070166 | 6/2006 |
| KR | 10-2007-0030250 | 3/2007 |
| KR | 10-2007-0072400 | 7/2007 |
| KR | 1020080013803 | 2/2008 |
| KR | 10-2008-0107220 | 12/2008 |

* cited by examiner

*Primary Examiner* — Shouxiang Hu
(74) *Attorney, Agent, or Firm* — Robert E. Bushnell, Esq.

(57) ABSTRACT

Disclosed is an organic light emitting diode device including a substrate, an organic light emitting element disposed on the substrate, a polymer resin layer covering the organic light emitting element, and a getter disposed between the organic light emitting element and the polymer resin. The getter may include a moisture absorbing material and a binder having a volatilization degree of about 400 ppm or less when heated at a temperature ranging from about 60° C. to about 120° C. for about 2 hours.

9 Claims, 6 Drawing Sheets

ORGANIC LIGHT EMITTING DIODE DEVICE

RELATED APPLICATIONS

This application claims priority to and the benefit of Korean Patent Application No. 10-2009-0127305 filed in the Korean Intellectual Property Office on Dec. 18, 2009, the entire contents of which are incorporated herein by reference.

BACKGROUND OF THE INVENTION

1. Field of the Invention

This disclosure relates to an organic light emitting diode device.

2. Description of the Related Art

An organic light emitting diode device (OLED device) among the flat panel displays includes a base substrate on which an organic light emitting element is disposed, and an encapsulation substrate is formed on the organic light emitting element for preventing degradation of the organic light emitting element.

The encapsulation substrate made of glass, and so on, may prevent the organic light emitting element from being degraded through blocking moisture from the outside. However, the encapsulation substrate may be damaged by external impact, and the thickness thereof may cause the thickness of organic light emitting diode device to increase.

SUMMARY OF THE INVENTION

One aspect of this disclosure provides an organic light emitting diode device that prevents degradation of an organic light emitting element by moisture, is strong against external impact, and is thin.

According to one aspect of this disclosure, an organic light emitting diode device may include a substrate, an organic light emitting element disposed on the substrate, a polymer resin layer covering the organic light emitting element, and a getter disposed between the organic light emitting element and the polymer resin layer. The getter includes a moisture absorbing material and a binder having a volatilization degree of about 400 ppm or less when heated at a temperature ranging from about 60° C. to about 120° C. for about 2 hours.

The polymer resin layer may include an epoxy resin.

The polymer resin layer may cover the whole surface of the upper and side of the organic light emitting element, and the getter may be disposed between the organic light emitting element and the polymer resin layer.

The binder may include a silicone resin, an epoxy resin, or a combination thereof.

The binder may include a silicone resin, and when the binder is cured at a temperature ranging from about 80° C. to about 120° C., its weight loss ranges about 0.6 wt % or less.

The binder may include an epoxy resin, and when the binder is cured at a temperature ranging from about 80° C. to about 120° C., its weight loss ranges about 1 wt % or less.

The moisture absorbing material may have a particle size ranging from about 10 nm to about 500 nm.

The moisture absorbing material also may have an average particle size ranging from about 150 nm to about 250 nm.

The moisture absorbing material may include one or more of aluminum (Al), magnesium (Mg), manganese (Mn), iron (Fe), calcium (Ca), barium (Ba), or strontium (Sr), or oxides thereof.

The moisture absorbing material and the binder may each be included in an amount of about 20 to about 80 wt % based on the total amount of the getter.

Further, the moisture absorbing material and the binder may be included in an amount of about 30 wt % to about 50 wt % and about 50 wt % to about 70 wt % based on the total amount of the getter, respectively.

The getter may be liquid.

An organic light emitting element can be prevented from being degraded by moisture, and a thin organic light emitting diode device that is strong against external impact by avoiding the use of an encapsulation substrate made of glass, and so on, may be also implemented. Consequently, a flexible organic light emitting diode device may be fabricated.

DETAILED DESCRIPTION OF THE INVENTION

Figure 1:
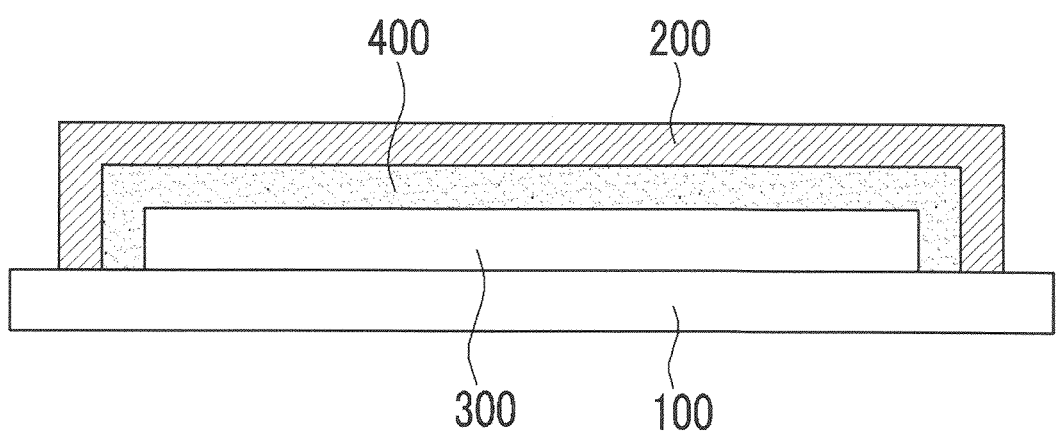
FIG. 1 is a cross-sectional view of an organic light emitting diode device according to one embodiment.

This disclosure will be more fully described hereinafter with reference to the accompanying drawings, in which exemplary embodiments of this disclosure are shown. As those skilled in the art would realize, the described embodiments may be modified in various different ways, all without departing from the spirit or scope of this disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Referring to FIG. 1, an organic light emitting diode device according to one embodiment is described in detail.

FIG. 1 is a cross-sectional view of an organic light emitting diode device according to one embodiment.

According to one embodiment, an organic light emitting diode device may include a substrate 100, an organic light emitting element 300 disposed on the substrate 100, a polymer resin layer 200 covering the organic light emitting element 300, and a getter 400 positioned between the organic light emitting element 300 and the polymer resin layer 200.

The substrate 100 may be made by a silicon wafer, a polymer, and the like.

The organic light emitting element 300 may include a pair of electrodes facing each other and an organic emission layer interposed between the pair of electrodes.

One of the electrodes may be an anode, while the other may be a cathode. The anode injects holes, has a high work function, and may be made of a transparent conductive material, for example, ITO or IZO, so that light can be emitted. The cathode injects electrons, has a low work function, and may be made of a conducting material having no influence on organic materials, which may be, for example, aluminum (Al), calcium (Ca), or barium (Ba).

The organic emission layer may include an organic light emitting material that is capable of emitting color when a voltage is applied to a pair of electrodes. The organic light emitting material may include an organic material inherently emitting any light among three primary colors of red, green, and blue; or may be a mixture of organic and inorganic materials. For example, it may include aluminum tris(8-hydroxyquinoline) (Alq3), anthracene, or a distryl compound. The organic light emitting diode device displays a desirable image by spatial-summing primary color light emitted from the emission layer.

An auxiliary layer (not shown) may be interposed between one electrode and an organic emission layer and between the other electrode and the organic emission layer. The auxiliary layer may include a hole transporting layer (HTL), a hole injecting layer (HIL), an electron injecting layer (EIL), and an electron transporting layer (ETL) for balancing electrons and holes.

The polymer resin layer 200 may seal the whole surface of the upper and side of the organic light emitting element 300 and may block moisture and oxygen from outside. The polymer resin layer 200, for example, may be made of an epoxy resin.

Thereby, degradation of the organic light emitting element 300 due to moisture may be prevented by covering the polymer resin layer 200 on the whole surface of the upper and side of the organic light emitting element 300. The polymer resin layer 200 replaces an encapsulation substrate made of glass, and so on, and may prevent damage that may be caused by external impact when using the encapsulation substrate, and the thickness may be decreased. Consequently, a flexible organic light emitting diode device may be fabricated.

The getter 400 may be disposed between the organic light emitting element 300 and the polymer resin layer 200. The getter 400 may absorb moisture passing through the polymer resin layer 200, and therefore, may prevent degradation of the organic light emitting element 300 due to moisture.

The getter 400 may be formed of a liquid getter composition.

The getter composition may include a moisture absorbing material and a binder.

The moisture absorbing material can absorb moisture and may include one or more of aluminum (Al), magnesium (Mg), manganese (Mn), iron (Fe), calcium (Ca), barium (Ba), or strontium (Sr), or oxides thereof.

The moisture absorbing material may be a powder, and may have a particle size ranging from about 10 nm to about 500 nm. When the moisture absorbing material has a particle size within the above range, the moisture absorbing material may have a larger specific surface area and effectively absorb moisture.

In addition, the moisture absorbing material may have an average particle size ranging from about 150 nm to about 250 nm. When the moisture absorbing material has an average particle size within the range, it may have a more uniform size, improving distribution property and producing increased life-span of a device.

The binder may include a silicone resin, an epoxy resin, or a combination thereof. Since the silicone resin and the epoxy resin are liquid before being cured, the getter composition does not need to include a solvent.

The binder may have a volatilization degree of about 400 ppm or less when heated at a temperature ranging from about 60° C. to about 120° C. for about 2 hours. In one embodiment, the binder may have a volatilization degree ranging from about 10 ppm to about 400 ppm. When the binder has a volatilization degree within the above range, it can have small out-gassing during the manufacturing process and/or during operation of the device, and can prevent the binder from permeating into the organic emission layer. Outside of the above range, after the manufacturing process and/or long-term operation, the volatilized component of the binder may permeate into the organic emission layer and form impurities. Therefore, a display defect such as a stain or a dark spot which can be recognized from outside the display area may be prevented.

When the binder includes a silicone resin and has the aforementioned volatilization degree, its weight loss ranges about 0.6 wt % or less at a temperature ranging from about 80° C. to about 120° C. When the binder includes an epoxy resin and the aforementioned volatilization degree, its weight loss ranges about 1 wt % or less when cured to at a temperature ranging from about 80° C. to about 120° C.

The moisture absorbing material and the binder may be respectively included in an amount of about 20 wt % to about 80 wt % based on the entire amount of the getter composition. When they are included within the above range, the moisture absorbing material and the binder may be respectively included in an amount ranging from about 30 wt % to about 50 wt % and about 50 wt % to about 70 wt % based on the entire amount of the getter composition.

The following examples illustrate this disclosure in more detail. These examples, however, are not in any sense to be interpreted as limiting the scope of this disclosure.

Preparation of Getter Composition

Preparation Example 1

A getter composition was prepared by mixing 30 wt % of calcium oxide having an average particle size of 100 nm and 70 wt % of a silicone resin.

Preparation Example 2

A getter composition was prepared by mixing 30 wt % of calcium oxide having an average particle size of 100 nm and 70 wt % of an epoxy resin.

Preparation Example 3

A getter composition was prepared by mixing 30 wt % of calcium oxide having an average particle size of 500 nm and 70 wt % of a silicone resin.

Comparative Preparation Example 1

A getter composition was prepared by including an epoxy resin.

Comparative Preparation Example 2

A getter composition was prepared by using 30 wt % of calcium oxide having an average particle size of 100 nm, 60 wt % of an epoxy resin, and 10 wt % of ethanol.

Preparation of Test Device

Example 1

A calcium (Ca) layer was applied on a glass substrate and then, the getter composition of Preparation Example 1 was applied at a thickness of 10 μm, and dried. Next, an epoxy resin was applied on the glass substrate, and UV was radiated to cure the epoxy resin.

Example 2

An organic light emitting diode device was fabricated according to the same method as Example 1 except for using the getter composition according to Preparation Example 2 instead of the getter composition according to Preparation Example 1.

Example 3

An organic light emitting diode device was fabricated according to the same method as Example 1 except for using the getter composition according to Preparation Example 3 instead of the getter composition according to Preparation Example 1.

Comparative Example 1

A calcium (Ca) layer was applied on a glass substrate.

Next, an epoxy resin (sealant) was applied along the edge of an encapsulation substrate that was made of glass using a dispenser.

The epoxy resin applied encapsulation substrate and the glass substrate to which calcium is applied were attached together, then, the sealing member was cured along with the edge of the encapsulation substrate using UV.

Comparative Example 2

A calcium (Ca) layer was applied on a glass substrate.

Next, an epoxy resin (sealant) was applied along the edge of an encapsulation substrate that was made of glass using a dispenser. Next, an epoxy resin and a silicone resin (filler) was filled instead of an epoxy resin of the encapsulation substrate, and the encapsulation substrate and the substrate to which calcium is applied were attached together, and then, the sealing member was cured along the edge of the encapsulation substrate using UV.

Measurement of Moisture Barrier Properties of Test Device

Moisture permeability test of test devices of Examples 1 to 3 and Comparative Examples 1 and 2 were performed.

Calcium (Ca) becomes transparent when it absorbs moisture. Using this property, permeability was measured at 85° C. temperature and 85% humidity.

Figure 2:
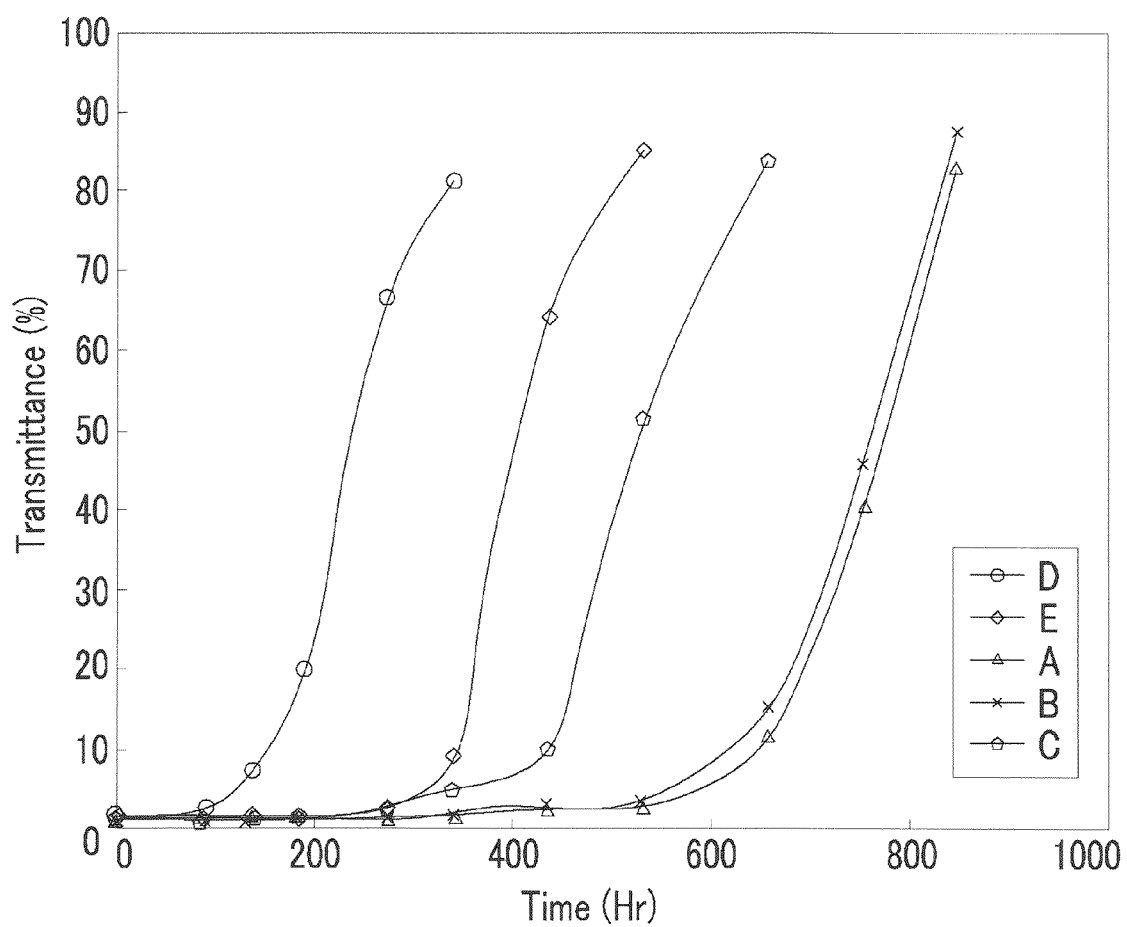
FIG. 2 is a graph showing moisture absorption of a getter composition according to Examples 1 to 3 and Comparative Examples 1 and 2.

FIG. 2 is used for this illustration in detail.

FIG. 2 is a graph showing moisture absorption of a getter composition according to Examples 1 to 3 and Comparative Examples 1 and 2.

Referring to FIG. 2, the test devices according to Example 1(A), Example 2(B), and Example 3(C) had lower permeability than those according to Comparative Example 1(D) and Comparative Example 2(E). The low permeability indicates low moisture permeability into a test device, and therefore, the test devices according to Examples 1 to 3 have excellent moisture barrier properties compared to those according to Comparative Example 1 and 2.

Fabrication of an Organic Light Emitting Diode Device

Example 4

ITO was sputtered on a glass substrate and then, patterned on it. Next, Aluminum tris 8-hydroxyquinoline aluminum (Alq3) was deposited thereon to form an electron transport layer. Then, an emission layer was disposed thereon by doping 1 wt % of coumarin 6 into Alq3 and co-depositing the resulting product. Next, a hole injection layer (HIL) and a hole transport layer were disposed thereon by sequentially depositing N,N-dinaphthalene-1-yl-N,N-diphenyl-benzidine (NPB). Then, Al was sequentially deposited, fabricating an organic light emitting element.

Next, the getter composition of Preparation Example 1 was applied on the organic light emitting element at a thickness of 10 μm, and dried. Next, an epoxy resin was is applied on the glass substrate, and UV was radiated to cure the epoxy resin.

Comparative Example 3

An organic light emitting element was formed on a glass substrate according to the same method as in Example 4.

Next, an epoxy resin was applied along the edge of an encapsulation substrate that was made of glass, using a dispenser.

The epoxy resin applied encapsulation substrate was covered on the organic light emitting element, and then, the epoxy resin was cured along the edge of the encapsulation substrate using UV.

Comparative Example 4

An organic light emitting element was formed on a glass substrate according to the same method as in Example 4.

Next, an epoxy resin was applied along the edge of an encapsulation substrate that was made of glass, using a dispenser. Next, an epoxy resin and a silicone resin (filler) was filled instead of an epoxy resin of the encapsulation substrate. The encapsulation substrate was covered on the organic light emitting element, and then, the epoxy resin sealing member was cured along the edge of the encapsulation substrate using UV.

Comparative Example 5

An organic light emitting diode device was fabricated according to the same method as in Example 4 except for using the getter composition according to Preparation Example 2 instead of the getter composition according to Preparation Example 1.

Display Characteristic Evaluation

The organic light emitting diode devices according to Example 4, Comparative Examples 3, 4 and 5 were allowed to stand at 85° C. temperature and 85% humidity and checked if they were stained or not as a function of time.

Referring to FIGS. 3 to 6, the display characteristic evaluation will be illustrated.

Figure 3:
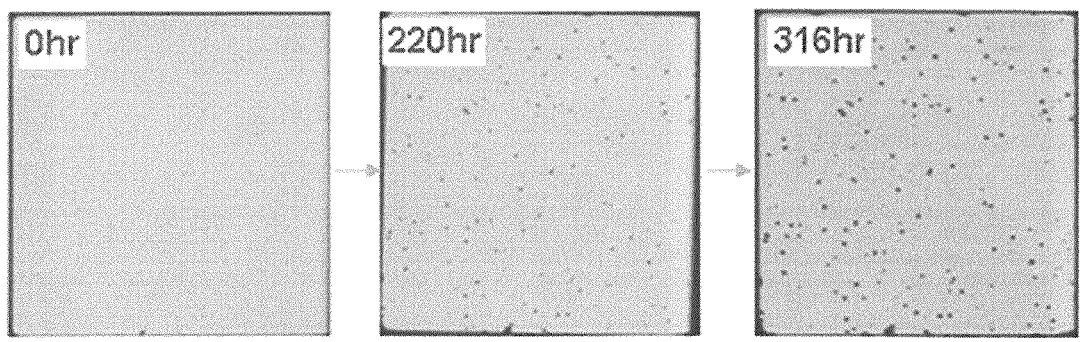
FIG. 3 is a photograph showing display characteristics of an organic light emitting diode device according to Example 4 over time.
Figure 4:
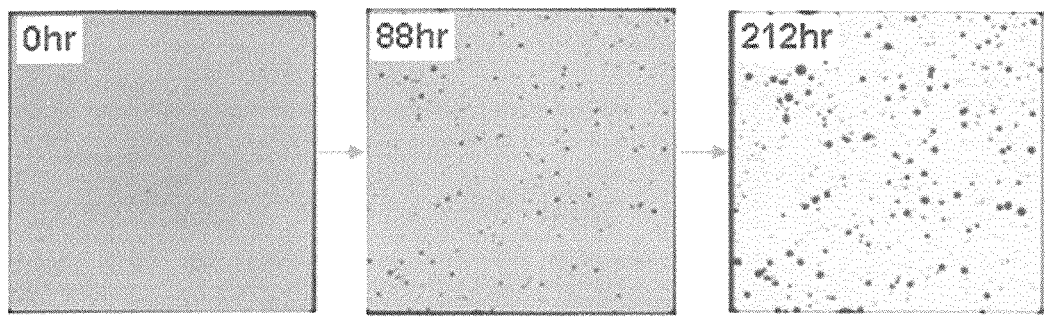
FIG. 4 is a photograph showing display characteristics of an organic light emitting diode device according to Comparative Example 3 over time.
Figure 5:
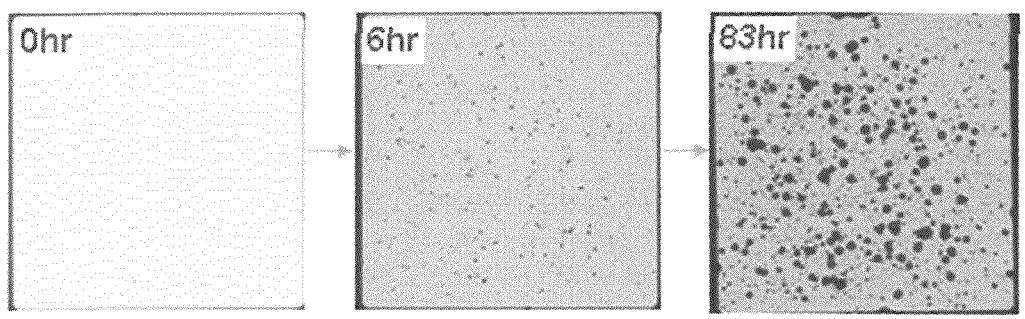
FIG. 5 is a photograph showing display characteristics of an organic light emitting diode device according to Comparative Example 4 over time.
Figure 6:
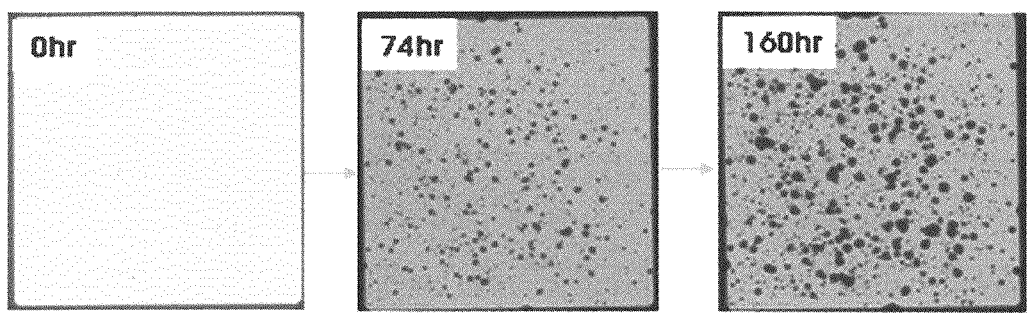
FIG. 6 is a photograph showing display characteristics of an organic light emitting diode device according to Comparative Example 5 over time.

FIG. 3 is a photograph showing display characteristics of the organic light emitting diode device according to Example 4 over time. FIG. 4 is a photograph showing display characteristic of the organic light emitting diode device according to Comparative Example 3 over time. FIG. 5 is photograph showing display characteristic of the organic light emitting diode device according to Comparative Example 4 over time. FIG. 6 is photograph showing display characteristic of the organic light emitting diode device according to Comparative Example 5 over time.

Referring to FIG. 3, the organic light emitting diode device according to Example 4 was not recognized to have a stain after 220 hours and a little spot after 316 hours.

On the contrary, FIG. 4 shows that the organic light emitting diode device of Comparative Example 3 after 6 hours turned out to have a similar stain to that of Example 4 allowed to stand for 316 hours. After 83 hours, it had more stains.

Referring to FIG. 5, the organic light emitting diode device according to Comparative Example 4 was recognized to have a partial stain after 88 hours and a plurality of stains after 212 hours. Referring to FIG. 6, the organic light emitting diode device according to Comparative Example 5 was recognized to have a partial stain after 74 hours and a plurality of stains after 160 hours.

These stains are caused by deterioration of an organic emission layer by moisture. Accordingly, since the organic light emitting diode device according to Example 4 blocks moisture inflow by an epoxy resin and the permeated moisture is removed by a getter, improved display characteristics can be obtained by preventing the organic light emitting element from being degraded.

Volatile components of a binder included in a getter composition can permeate into an organic emission layer and form impurities that can be externally displayed. Accordingly, when a getter composition according to an exemplary embodiment is used, stains can be significantly reduced by controlling volatilization degrees of a binder.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode device, comprising:
   a substrate;
   an organic light emitting element disposed on the substrate;
   a polymer resin layer covering the organic light emitting element; and
   a getter disposed between the organic light emitting element and the polymer resin layer, wherein the getter continuously covers and is in contact with the whole of the upper and side surfaces of the organic light emitting device,
   the getter comprised of:
      a moisture absorbing material; and
      a binder that has been heated at a temperature ranging from about 60° C. to about 120° C. for about 2 hours at atmospheric pressure before incorporation into the OLED device, wherein the binder comprises a silicone resin, an epoxy resin, or a combination thereof,
   wherein the polymer resin layer continuously covers and is in contact with the whole of the upper and side surfaces of the getter.

2. The organic light emitting diode device of claim 1, wherein the polymer resin layer comprises an epoxy resin.

3. The organic light emitting diode device of claim 1, wherein the polymer resin layer covers the whole surface of the upper and the side of the organic light emitting element.

4. The organic light emitting diode device of claim 1, wherein the moisture absorbing material has a particle size ranging from about 10 nm to about 500 nm.

5. The organic light emitting diode device of claim 4, wherein the moisture absorbing material has an average particle size ranging from about 150 nm to about 250 nm.

6. The organic light emitting diode device of claim 1, wherein the moisture absorbing material comprises one or more of aluminum (Al), magnesium (Mg), manganese (Mn), iron (Fe), calcium (Ca), barium (Ba), or strontium (Sr), or oxides thereof.

7. The organic light emitting diode device of claim 1, wherein the moisture absorbing material and the binder are each included in an amount of about 20 wt % to about 80 wt % based on the total entire amount of the getter composition.

8. The organic light emitting diode device of claim 7, wherein the moisture absorbing material and the binder are included in an amount of about 30 to about 50 wt % and about 50 to about 70 wt % respectively based on the total amount of the getter composition.

9. The organic light emitting diode device of claim 1, wherein the getter is formed from a liquid getter composition.

* * * * *